(12) United States Patent
Hirakawa et al.

(10) Patent No.: US 6,499,935 B1
(45) Date of Patent: Dec. 31, 2002

(54) PHOTOMASK CASE, TRANSPORTING APPARATUS, AND TRANSPORTING METHOD

(75) Inventors: Shinichi Hirakawa, Tokyo (JP); Kanefumi Nakahara, Tokyo (JP); Yutaka Endo, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/511,993

(22) Filed: Feb. 24, 2000

Related U.S. Application Data

(63) Continuation-in-part of application No. PCT/JP98/03738, filed on Aug. 24, 1998.

(30) Foreign Application Priority Data

Aug. 29, 1997 (JP) .............................................. 9-247553

(51) Int. Cl.⁷ ................................................ B25J 15/02
(52) U.S. Cl. ...................... 414/741; 414/729; 294/87.26
(58) Field of Search ................... 414/729, 741; 294/86.4, 87.26, 68.3, 902; 901/39

(56) References Cited

U.S. PATENT DOCUMENTS

| 3,968,885 A | * | 7/1976 | Hassan et al. ............ 901/39 X |
| 4,723,353 A | * | 2/1988 | Monforte ................... 901/39 X |
| 4,830,182 A | | 5/1989 | Nakazato et al. |
| 4,851,692 A | | 7/1989 | Villano |
| 5,353,934 A | | 10/1994 | Yamauchi |

FOREIGN PATENT DOCUMENTS

| EP | 0 582 016 A1 | 8/1992 |
| JP | 63-11636 | 1/1988 |
| JP | 63-216355 | 9/1988 |
| JP | 3-109750 | 5/1991 |
| JP | 8-17906 | 1/1996 |

\* cited by examiner

*Primary Examiner*—Donald W. Underwood
(74) *Attorney, Agent, or Firm*—Oliff & Berridge PLC

(57) ABSTRACT

This mask case is a mask case for accommodating a reticle formed with a pattern to be transferred to a substrate, in which one outer wall face of the mask case is formed with first and second depressions and the form of the first depression is one of conical and triangular pyramidal forms, whereas the second depression has a V-groove form.

8 Claims, 21 Drawing Sheets

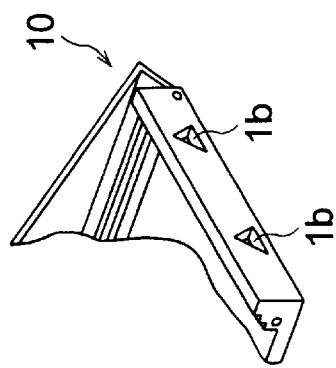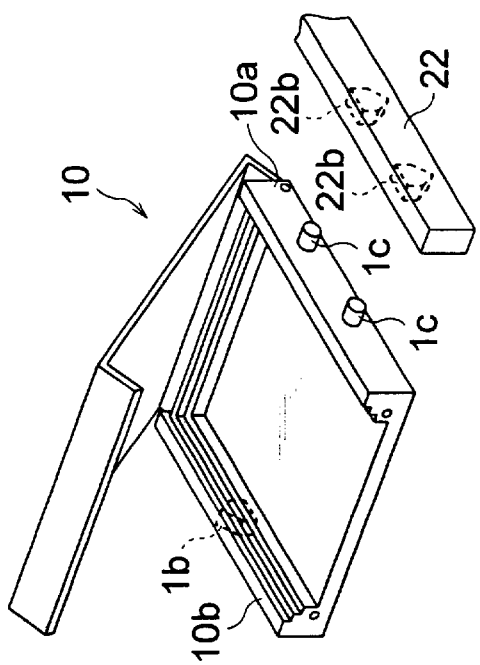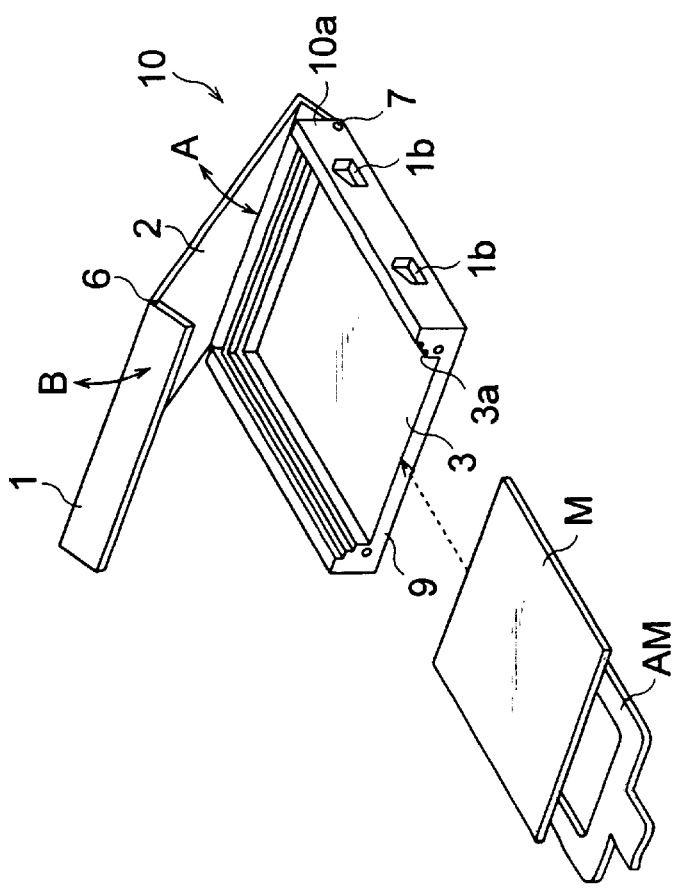

PHOTOMASK CASE, TRANSPORTING APPARATUS, AND TRANSPORTING METHOD

RELATED APPLICATION

This is a continuation-in-part application of application Ser. No. PCT/JP98/03738 filed on Aug. 24, 1998, now pending.

BACKGROUND OF THE INVENTION

1. Field of the Invention

The present invention relates to a photomask case, a transporting apparatus, and a transporting method; and, in particular, to a photomask case used when making a semiconductor, a liquid crystal display device, or the like in a photolithography process, and a transporting apparatus and method for transporting this photomask case.

2. Related Background Art

In a lithography process (process of forming a resist image of a mask pattern onto a substrate) for making a semiconductor device and the like, there is used a projection exposure apparatus (stepper or the like) for exposing, by way of a projection optical system, a reticle pattern as a photomask (hereinafter referred to as mask) onto a substrate (or a wafer or the like) coated with a photoresist.

There has been proposed an automatic transportation system which automatically transports this mask in a state accommodated in a photomask case (hereinafter referred to as mask case) successively through various processing apparatus such as a cleaning apparatus for the mask, a dust inspecting apparatus, a pellicle mounting apparatus, an exposure apparatus, and the like. According to this automatic transportation system, when a mask case is to be transported between various apparatus, the mask having completed its processing within a processing apparatus is accommodated in the mask case and is transported by a transporting section of this processing apparatus to a mask delivery site in the processing apparatus and is placed there.

The mask case placed at the delivery site of the processing apparatus is transported by an external transporting apparatus to a delivery site of another processing apparatus and is placed there. The mask case placed at the delivery site of this processing apparatus is adapted to be transported by a transporting section of the processing apparatus to a predetermined processing site.

SUMMARY OF THE INVENTION

When the mask case is transported between various processing apparatus, positional deviations at the time of delivering the mask case become problematic. Unless the transporting section of a processing apparatus places a mask case at the delivery site of this processing apparatus with a certain degree of accuracy, the external transporting apparatus cannot hold this mask case, so that an error will occur in the system, thereby making the subsequent processing impossible.

It is an object of the present invention to provide a mask case, transporting apparatus, and transporting method which can accurately achieve positioning when transporting the mask case. Namely, a predetermined part of the mask case is provided with a positioning depression into which a support pin projecting from an installation site is inserted, whereby accurate positioning is effected. If positioning depressions of the mask case are arranged such that their deepest portion is disposed on the outer side of the mask case than is a support member for supporting a mask, then it is possible to reduce the total height of a plurality of mask cases when they are stacked.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 7 is a perspective view of a mask case 10 in accordance with a second embodiment;

FIG. 8 is a perspective view of a mask case 10 in accordance with a third embodiment;

FIG. 9 is a perspective view of a mask case 10 in accordance with a fourth embodiment;

DESCRIPTION OF THE PREFFERED EMBODIMENTS

Figure 1:
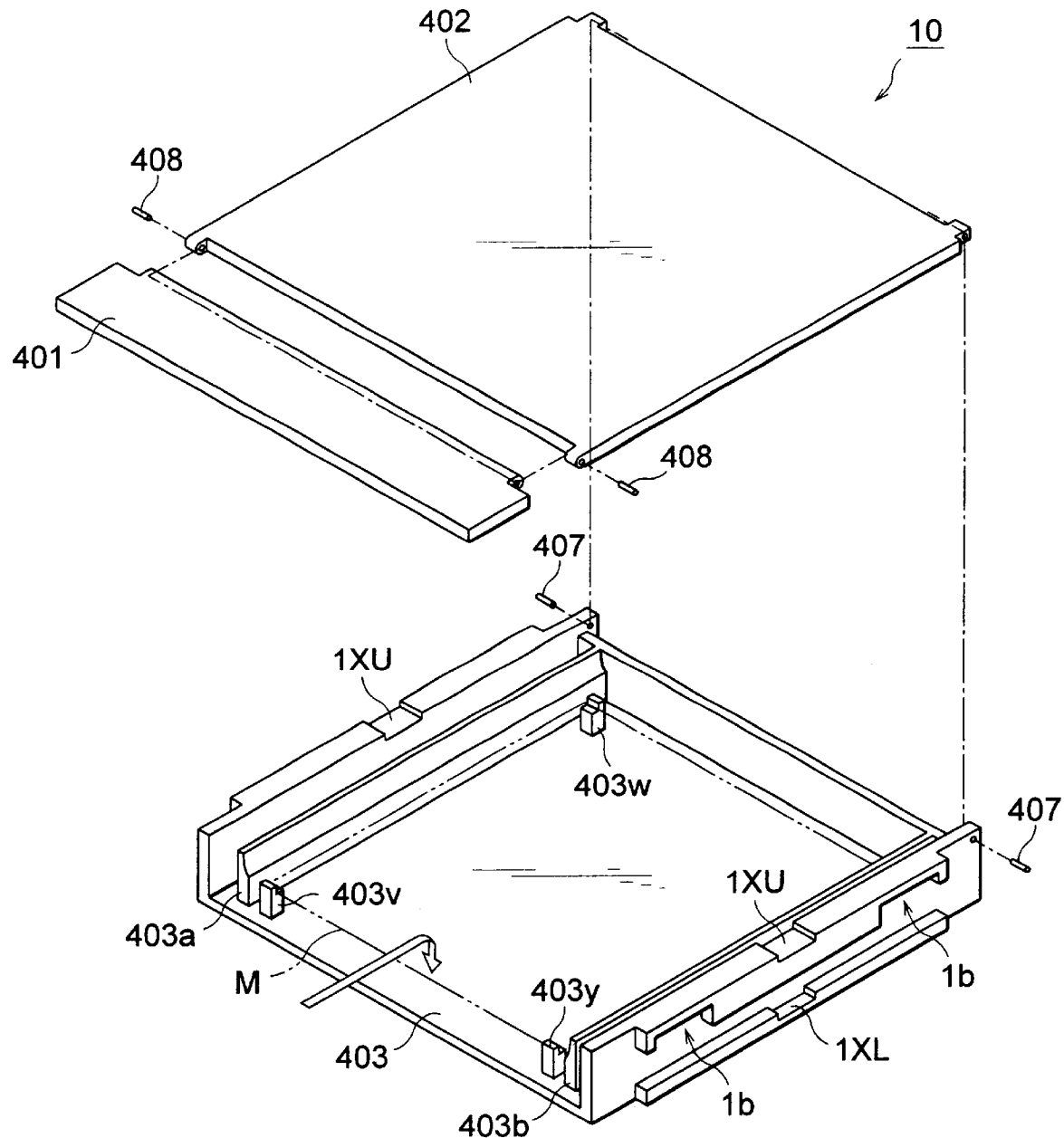
FIG. 1 is a perspective view of a mask case 10 in accordance with a first embodiment.
Figure 2:
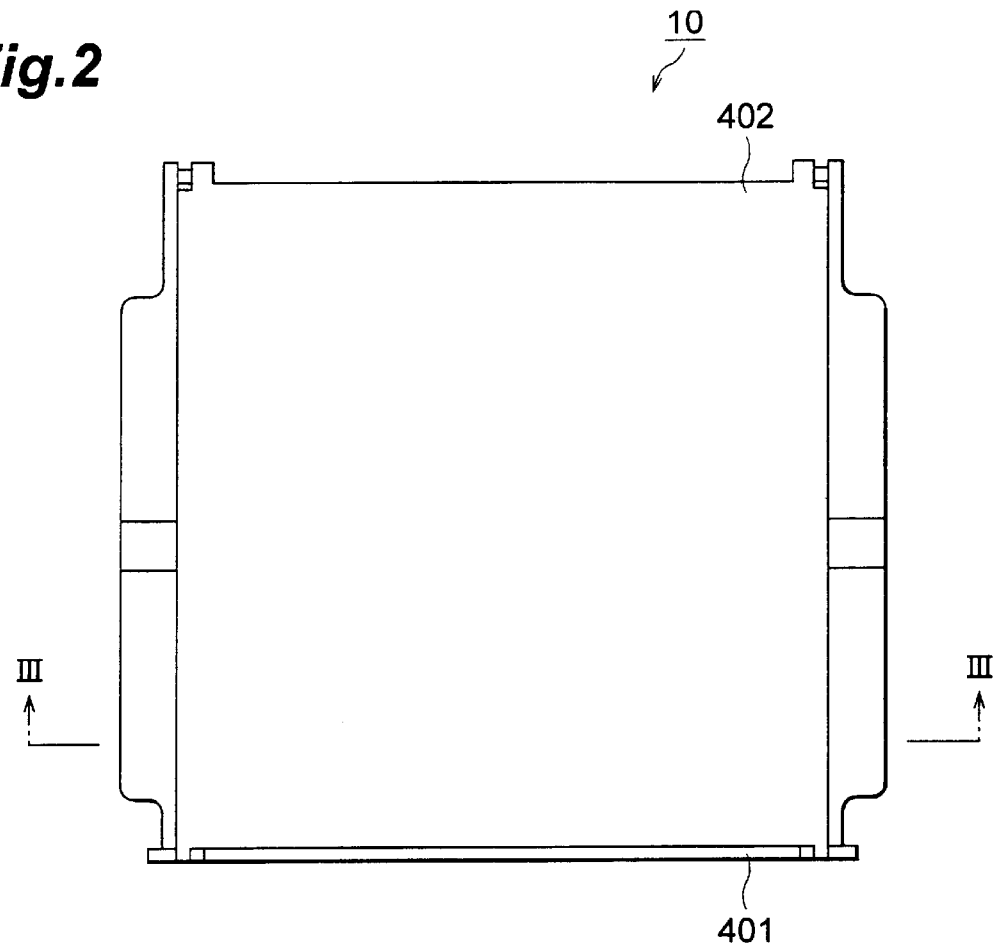
FIG. 2 is a plan view of the mask case shown in FIG. 1.

In the following, mask cases, transporting apparatus, and transporting methods in accordance with embodiments will be explained. Constituents identical to each other or having functions identical to each other will be referred to with numerals or letters identical to each other, without repeating their overlapping descriptions. Also, in the following explanation, words "upper" and "lower" are assumed to be based on the upper and lower sides of FIG. 1.

FIGS. 1 to 6 show a mask case 10 in accordance with a first embodiment. The mask case 10 has a lower housing 403 and an upper lid 402. The lower housing 403 is shaped like a dustpan and has three side walls raised along outer edges of its rectangular bottom plate which constitute three sides thereof. The remaining one side of the rectangular bottom plate of the lower housing 403 has no side wall thereon, and is positioned at the front face of the mask case.

On the bottom plate of the lower housing 403, guide plates 403a, 403b extending parallel to the left and right side walls are raised. Each of the guide plates 403a, 403b has a curvature on their inner side. Namely, the inner side face of each of the opposing guide plates 403a, 403b has a curved surface 411 whose center axis of curvature lies in the front-to-rear direction of the mask case 10. Slightly inside the guide plates 403a, 403b, four support members 403v, 403w, 403x, 403y raised from the upper face of the bottom plate are secured.

As a consequence, in the case where, after a photomask (reticle) M supported on a fork (take-up arm AM) (see FIG. 7) is inserted into the mask case 10 from the front face side thereof, the fork is moved to the bottom plate side (as indicated by the whitened arrow in FIG. 1), the reticle M slides, even if its position is shifted more or less, toward the inner side of the mask case 10 along the curved surface 411, so as to be mounted on the support members 403v, 403w, 403x, 403y. The support members 403v, 403w, 403x, 403y each have a step portion for restricting the back-and-forth movement of the reticle M, whereby the back-and-forth movement of the reticle M at the time of insertion and extraction of the fork is restricted.

The upper lid 402 is secured on its rear face side, by way of a hinge having pins 407, to the rear face side of the lower housing 403 so as to cover the upper face open end of the lower housing 403. Namely, though the upper lid 402 is secured to the lower housing 403 by way of a suitable lock mechanism, the lock can be released when necessary, so as to pivot the upper lid 402 about the hinge, thereby causing its interior to attain an open state.

Figure 4:
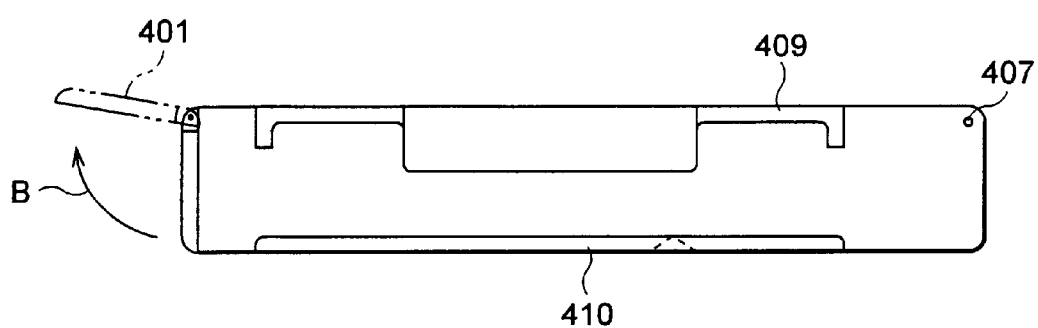
FIG. 4 is a side view of the mask case shown in FIG. 1.
Figure 5:
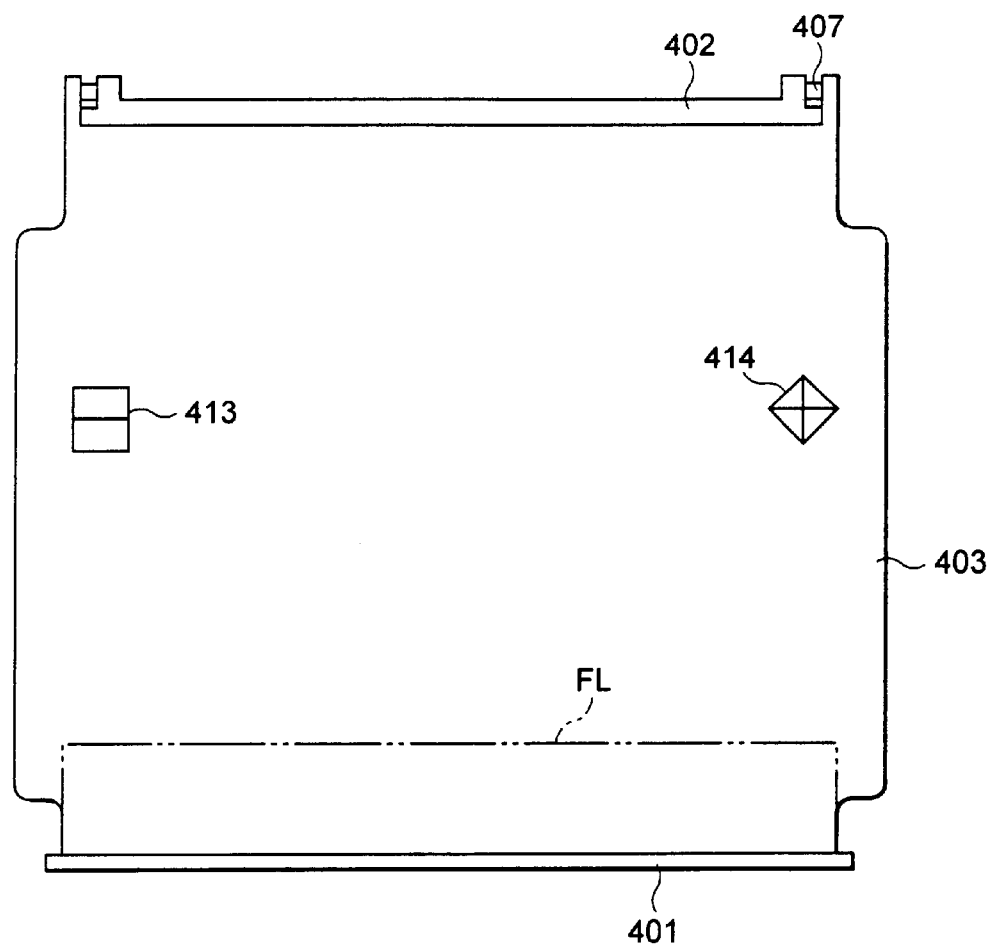
FIG. 5 is a bottom view of the mask case shown in FIG. 1.
Figure 6:
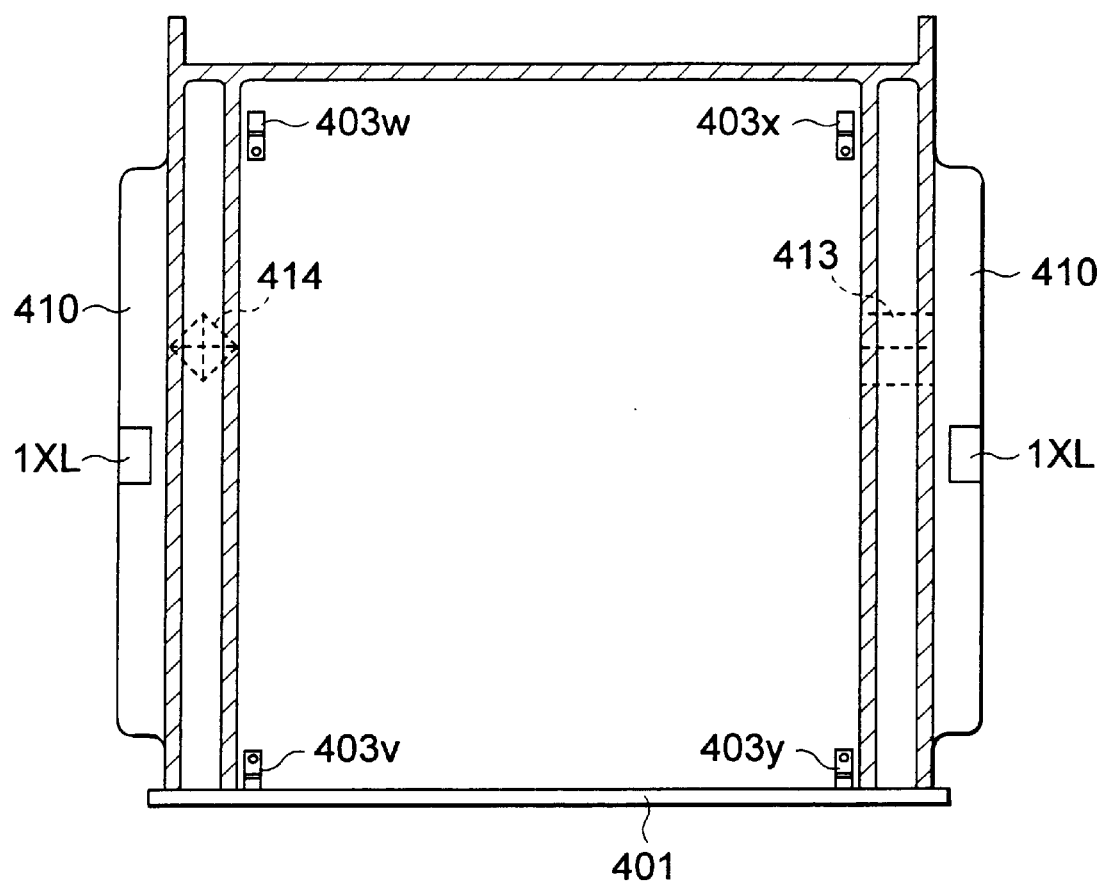
FIG. 6 is a sectional view of the mask case shown in FIG. 3, taken along the arrow line VI—VI.

On the front face side of the upper lid 402, a front face lid (movable wall) 401 is disposed by way of a hinge having pins 408 and swings along the direction indicated by the arrow B in FIG. 4. This movable wall 401 opens and closes in synchronization with the insertion and extraction of the reticle M; and, in its open state, an insertion slot for the reticle M is formed in the housing 403.

Passages 412 closed on the rear face side are formed between the guide plates 403a, 403b and their corresponding left and right side walls of the lower housing 403. Under the respective passages 412, depressions (pits) 413, 414 depressed from the lower face side to upper face side of the bottom plate are formed. The inner faces of the depressions 413, 414 constitute a V-groove form and a quadrangular pyramidal form, respectively. The passages 412 are located where they do not interfere with the reticle M. The parts of upper face of the bottom plate directly above the depressions 413, 414 are protruded some or less so that the deepest portions of the depressions 413, 414 do not open to the inside of the case.

If the depressions 413, 414 are formed inside of the support members 403v, 403w, 403x, 403y, there is a possibility of these protrusions 413p, 414p interfering with the fork for transporting the reticle M. For suppressing this interference, the thickness of the bottom plate may be increased without providing the protrusions 413p, 414p. In this case, however, the height (thickness) of the mask case 10 increases. In particular, when a plurality of mask cases are stacked in an apparatus such as a reticle library or the like, for example, the amounts of increase accumulate, thereby enhancing the dimensions of the apparatus. In this embodiment, since the deepest portions of the depressions 413, 414 for positioning the mask case are located on the outer side of the mask case than are the support members 403v, 403w, 403x, 403y, the total height of a plurality of mask cases 10 can be reduced when they are stacked.

Figure 3:
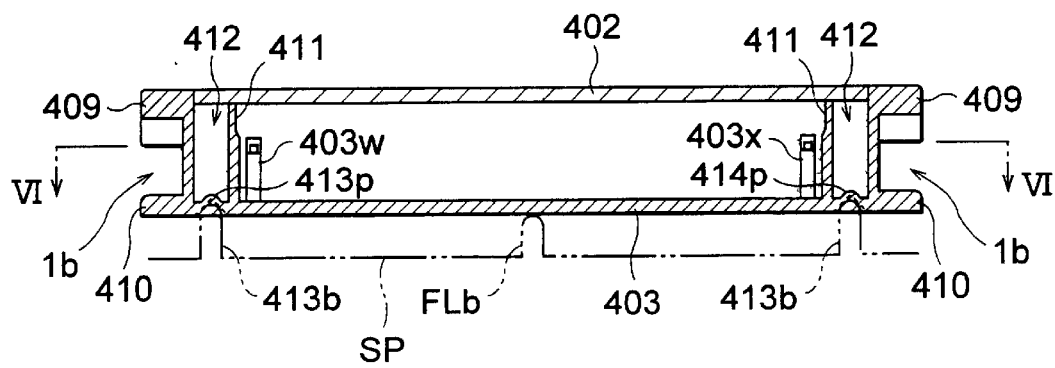
FIG. 3 is a sectional view of the mask case shown in FIG. 2, taken along the arrow line III—III.

Tip portions of support pins 413b, 414b having a predetermined height from a reference plane SP are fitted into their corresponding positioning depressions 413, 414 (FIG. 3). Since a plane is defined by three points, a support pin FLb is further disposed on the reference plane SP. The support pin FLb has a height smaller than that of any of the remaining two. The support pin FLb abuts against a front-face-side area FL in the lower face of the bottom plate. The front-face-side area FL is a plane. This area FL may be depressed from the remaining area of the lower face. In other words, it will be sufficient if the three support pins 413b, 414b, FLb eventually abut against their respective positions, so that the upper face of the bottom plate is held horizontally. Here, the reference plane SP is a surface of one shelf of a reticle library, for example.

In the state where the support pins 413b, 414b, FLb abut against their respective positions, the mask case 10 is pressed from the upper side so that positioning is accurately effected. Each of the left and right side walls of the mask case 10 is provided with an upper projection 409 and a lower projection 410 which project outward. These upper projection 409 and lower projection 410 also function as reinforcing ribs, thereby strengthening the side walls. The respective upper faces of the upper projection 409 and lower projection 410 are provided with clamp areas 1XU and 1XL for pressing the case.

The clamp areas 1XL and 1XU are slightly depressed toward the lower side. As a pressing pin (not shown) abuts onto and stresses the depressed clamp area 1XL or 1XU from the upper side, the mask case is made immobile with respect to the reference plane SP. Also, the depressed region of each of the clamp areas 1XL and 1XU forms a step portion with respect to its surroundings. When the above-mentioned pressing pin abuts against this step portion, the case is restrained from moving back and forth.

Figure 24:
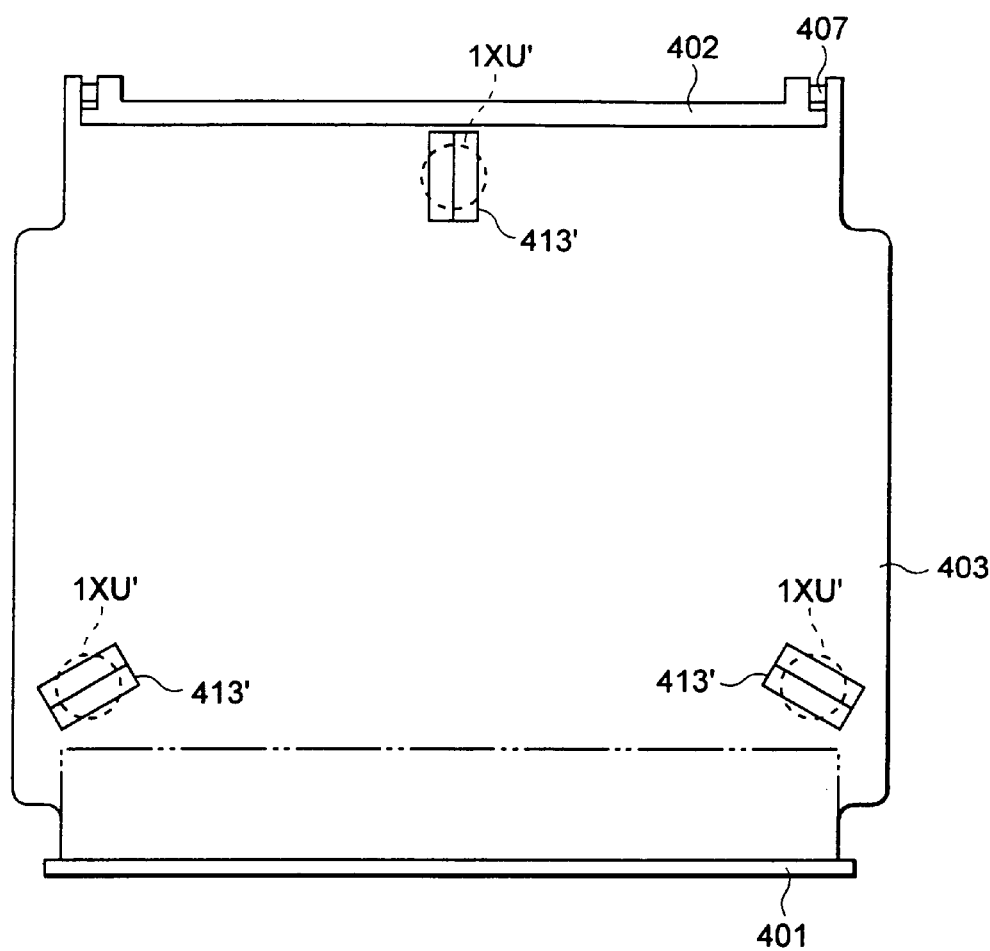
FIG. 24 is a bottom view of a mask case in accordance with an embodiment.

Here, the positioning depressions can be disposed at various positions explained later. For example, as shown in FIG. 24, three depressions 413' each having a V-groove form are provided in the lower face of the bottom plate and are arranged such that the respective extending directions of the V-grooves form an angle of 120 degrees therebetween. In such a case, three circular clamp areas 1XU' provided in the upper face of the upper lid 402 may be positioned directly above the three respective depressions 413'.

Into two spaces 1b between the upper projections 409 and lower projections 410 of the respective side walls, cylindrical supports (see 21a, 22a of FIGS. 10 and 11) are fitted as with those in embodiments which will be explained later, and the mask case 10 is transported in thus held/clasped state.

FIGS. 7, 8, and 9 are perspective views of mask cases 10 in accordance with second, third, and fourth embodiments, respectively. The size of the reticle M is standardized at specific dimensions. Also, a circuit pattern (not shown) is drawn with predetermined margins around the mask.

The reticle M is adapted to be accommodated in a dustpan-shaped bottom lid 3 shown in FIG. 7. As depicted, a wall is provided around the bottom lid 3 except for its open end face 9. Three step portions 3a are provided in an upper part of the wall. The step portions 3a hold edge portions of the reticle.

An upper lid 2 is attached to the bottom lid 3, on the side opposite to the open end face 9, so as to be freely opened and closed as indicated by the arrows A in the drawing by means of a hinge 7, and is adapted to close the upper face of the bottom lid 3.

Further, an opening and closing member 1 is attached to the open end face 9 side of the upper lid 2 by way of a hinge 6 so as to be pivotable with respect to the upper lid 2 as indicated by the arrows B in the drawing. In the state where the opening and closing member 1 is open, the reticle M can be inserted into and extracted from the mask case 10 by means of a mask take-up arm AM.

As the upper lid 2 pivots to engage the step portion, and the opening and closing member 1 closes the open end face 9, the mask is accommodated in a substantially hermetic state.

Also, side face portions 10a, 10b of the opening and closing member 1 are formed with four depressions 1b (two on each side), as depicted, for receiving arm tips of a mask case transporting apparatus which will be explained later. Each depression 1b has a pentagonal cross section in which an isosceles triangle is mounted on a rectangle. The relationship between the depressions 1b and arms of the transporting apparatus will be explained later.

Figure 10:
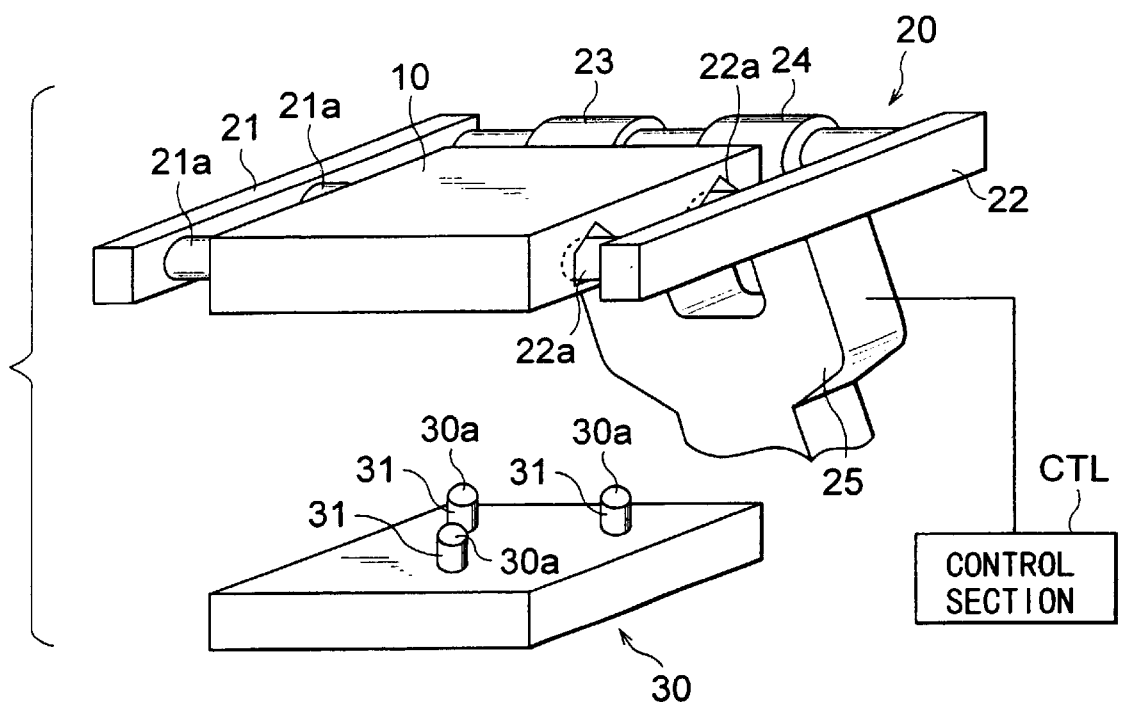
FIG. 10 is a perspective view showing a transporting apparatus 20 in accordance with an embodiment in a state where the mask case 10 is transported from an unshown storage site and is positioned above a stage 30 which is a transporting site.

FIG. 10 is a perspective view showing a transporting apparatus 20 in accordance with an embodiment in a state where the mask case 10 from an unshown storage site is held and positioned above a stage 30. The transporting apparatus 20 comprises two arms 21, 22 extending in parallel; actuators 23, 24 for driving the individual arms 21, 22 in a direction in which the arms 21, 22 approach each other or separate from each other; and a support member 25 for supporting the actuators 23, 24. The actuators 23, 24 and the support member 25 are driven under the control of a control section CTL. The control section CTL controls the movement of the support member or engagement and support member.

One arm 21 has two cylindrical portions 21a, and the other arm 22 also has two cylindrical portions 22a. The cylindrical portions 21a, 22a oppose each other. Each of the distance between the cylindrical portions 21a and the distance between the cylindrical portions 22a accurately coincides with the distance between the depressions 1b.

In the state where the arms 21, 22 are positioned beside the mask case 10 placed at an unshown storage site, if the actuators 23, 24 are operated under the control of the control section CTL so as to move arms 21, 22 toward each other, then the cylindrical portions 21a, 22b enter the depressions 1b in the mask case 10.

If the support member 25 is lifted from this state under the control of the control section CTL, then the arms 21, 22 move up together therewith. At this time, since the upper faces of the depressions 1b are pushed by the cylindrical portions 21a, 22a, the mask case 10 moves up together with the arms 21, 22. Upon this operation, the transporting apparatus 20 attains a state where it can hold and transport the mask case 10. Here, FIG. 10 shows the state where the transporting apparatus 20 has transported the mask case 10 above the stage 30 that is the aimed transporting site.

Figure 11:
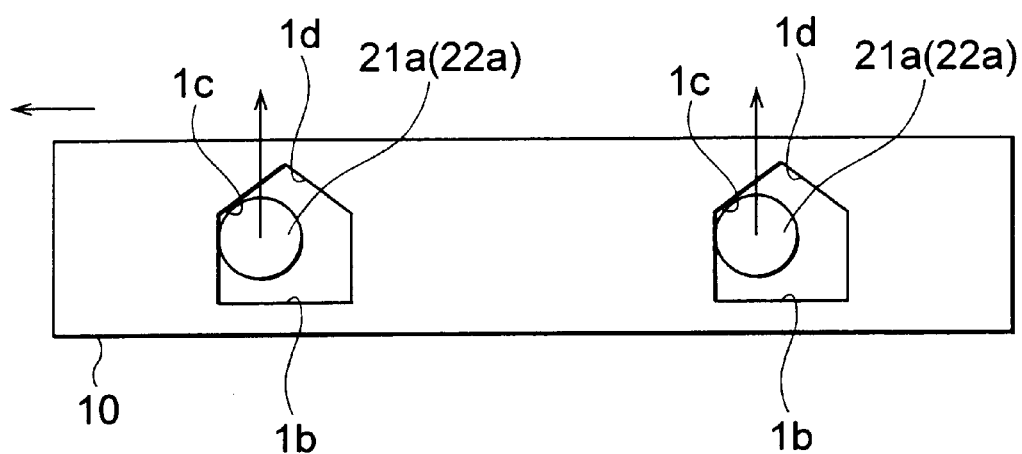
FIG. 11 is a view showing a relationship of forces between cylindrical portions 21a and depressions 1b of the mask case 10.

An embodiment in which the positioning of the mask case 10 is achieved by use of the cylindrical portions 21a, 22a and depressions 1b will now be explained. FIG. 11 is a view showing a relationship of forces between the cylindrical portions 21a (22a) and the depressions 1b of the mask case 10. Here, it is assumed that relative positions of the arms 21, 22 and the mask case 10 are slightly shifted from each other (the mask case 10 is shifted rightward with respect to the arms 21, 22).

In this state, if the cylindrical portions 21a (22a) are inserted into the depressions 1b of the mask case 10, and the arms 21, 22 are lifted with respect to the mask case 10, then the cylindrical portions 21a (22a) move up within the depressions 1b and then abut against the left-side slopes 1c formed in the upper portions of the depressions 1b.

If the arms 21, 22 further move up, then the cylindrical portions 21a (22a) push the left-side slopes 1c. However, as the bottom face of the mask case leaves the upper face of the storage site, the frictional force between these faces decreases, whereby the mask case 10 moves in a horizontal direction (leftward in the drawing) with respect to the arms 21, 22 according to its own weight and the reaction force in the normal direction received by the left-side slopes 1c from the cylindrical portions 21a (22a).

Further, as the cylindrical portions 21a (22a) abut against right-side slopes 1d intersecting the left-side slopes 1c, the mask case 10 stands still since its own weight is balanced with the reaction forces acting between the slopes 1c, 1d and cylindrical portions 21a (22a). At this moment, the accurate positioning of the mask case 10 with respect to the arms 21, 22 is achieved. Namely, the positioning of the mask case 10 is automatically achieved when it is simply lifted by the arms 21, 22. In FIG. 10, if the stage is assembled to arms (not shown) of another transporting apparatus, the positioning of the mask case 10 at the time of delivery with respect to the transporting apparatus 20 can also be effected.

Though two depressions 1b are disposed on each side of the mask 10 in this embodiment, two depressions may be disposed on one side, while one depression is disposed on the other side such that the distances therefrom to the two depressions on the one side equal each other. Since the mask case is supported at three points in this arrangement, it would be held more stably.

Further, the depressions 1b may not have a pentagonal cross section, and their cross section may be triangular as shown in FIG. 8, for example. Also, it is not always necessary for the side face portion 10a to have depressions.

Figure 23:
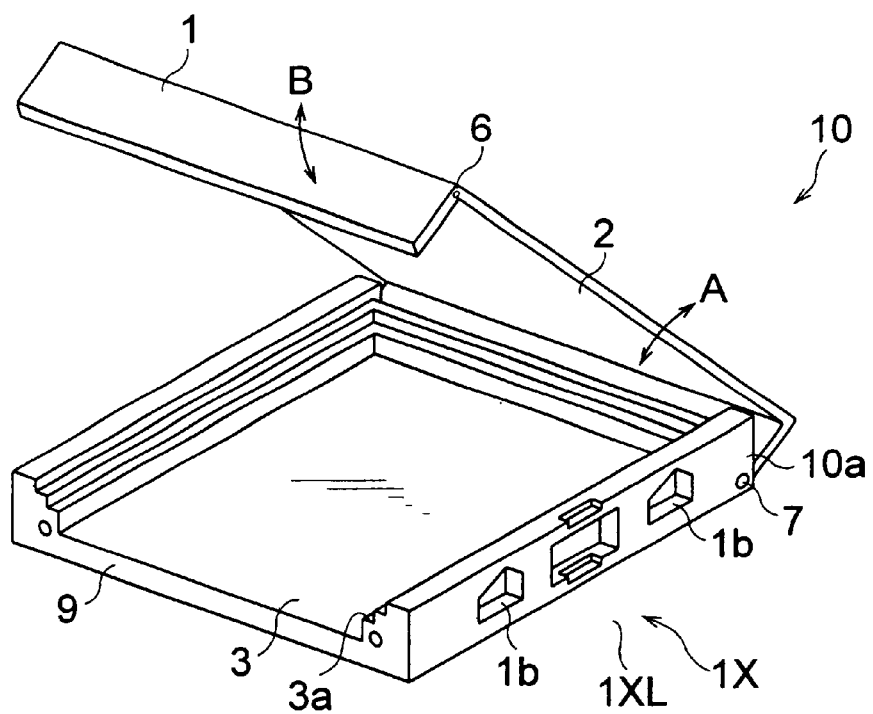
FIG. 23 is a perspective view of a mask case showing a modified example of mask case.

For example, as shown in FIG. 9, the side face portion 10a may be formed with two cylindrical portions 1c, while its opposing arm 22 is formed with depressions 22b, and the opposite side face portion 10b may be formed with one depression 1b, while its opposing arm (not shown) is formed with a cylindrical portion. Alternatively, the side face portion 10a may be provided with one cylindrical portion and one depression, while its corresponding arm is provided with one depression and one cylindrical portion. Further, as shown in FIG. 23, a depression 1x where the lower clamp area 1XL of FIG. 1 is formed may be provided between the depressions 1b.

Figure 12:
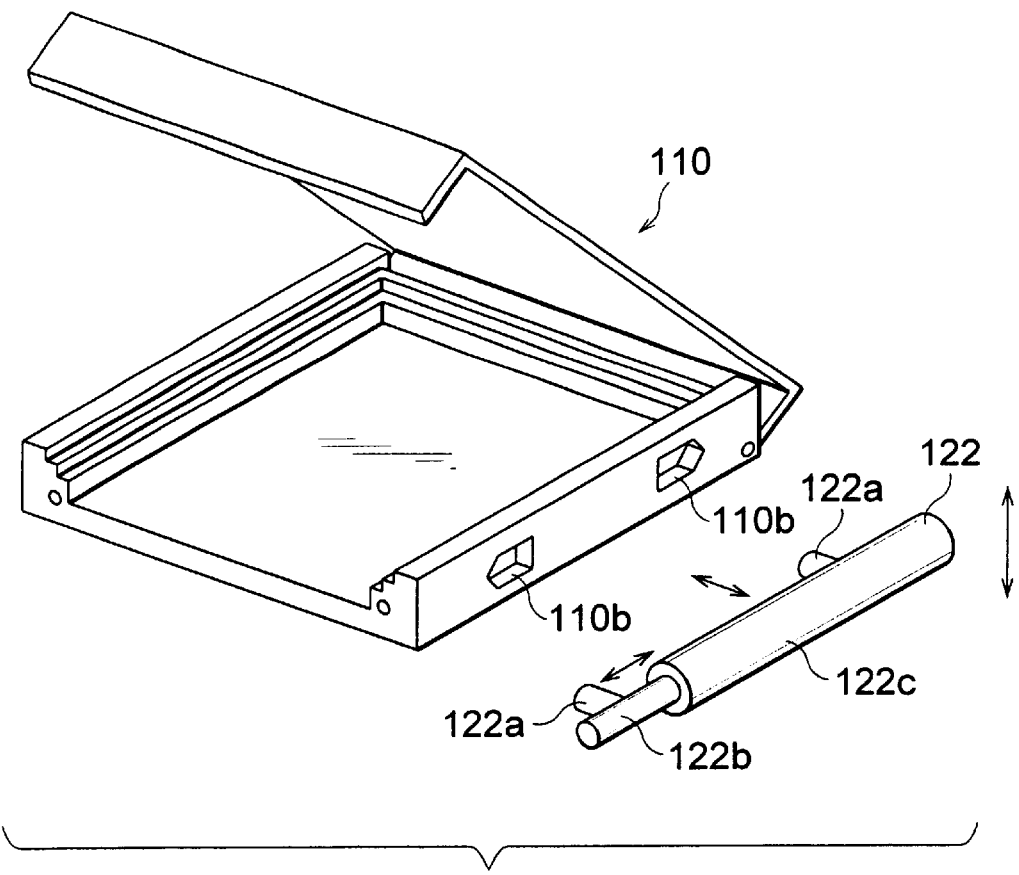
FIG. 12 is a perspective view showing a mask case 110 in accordance with a fifth embodiment together with an arm 122 on one side.

FIG. 12 is a perspective view showing a mask case 110 in accordance with a fifth embodiment together with an arm 122 on one side. The mask case 110 of FIG. 12 differs from the mask case 10 of FIG. 7 only in the form of depressions 110b. More specifically, the depressions 110b each have a pentagonal cross section in which a triangle is joined beside a rectangle (i.e., a form in which the depression 1b of the embodiment shown in FIG. 7 is turned sideways) such that their respective pointed ends are directed away from each other.

On the other hand, the arm 122 has, for example, a main body 122c incorporating an air cylinder therein, and a movable portion 122b longitudinally movable by the air cylinder. Each of the main body 122c and the movable portion 122b is formed with a cylindrical portion 122a. The distance between the cylindrical portions 122a is changeable as the movable portion 122b is moved relative to the main body 122c. Further, the arm 122 is movable toward and away from the mask case 110 and is also movable in vertical directions. Though not depicted, a similar arm is formed on the opposite side of the mask case 110 from the arm 122.

An embodiment in which the positioning of the mask case 110 is achieved by use of the cylindrical portions 122a and depressions 110b will now be explained. Here, it is assumed that, though the relative positions of the arm 122 and the mask case 110 are slightly shifted from each other, they are disposed at such relative positions that each cylindrical portion 122a can enter its corresponding depression 110 as the arm 122 approaches the mask case 110.

In this state, the arm 122 is caused to approach the mask case 110, so that the cylindrical portions 122a are inserted into their corresponding depressions 110b, and the mask case 110 is lifted while being held between the arm 122 and the unshown arm. Upon this operation, the mask case 110 can be transported to a predetermined position. On the other hand, if the movable portion 122b of the arm 122 is moved so as to extend while the mask case 110 is kept lifted, then both cylindrical portions 122a move away from each other and then abut against their corresponding pointed ends of the depressions 110b, whereby the mask case 110 is securely held by the arm 122.

In this case, since the cylindrical portion 122a on the main body 122c side does not move, the relative positions of this cylindrical portion 122a and its corresponding depression 110b are always uniquely determined, whereby the accurate positioning of the mask case 110 with respect to the arm 122 is achieved. Namely, the positioning of the mask case 110 is automatically achieved when it is simply lifted by the arm 122. Here, the depressions 110b may be formed such that their respective pointed ends are directed toward each other. In this case, the positioning is achieved as both cylindrical portions 122a are moved toward each other.

Figure 13:
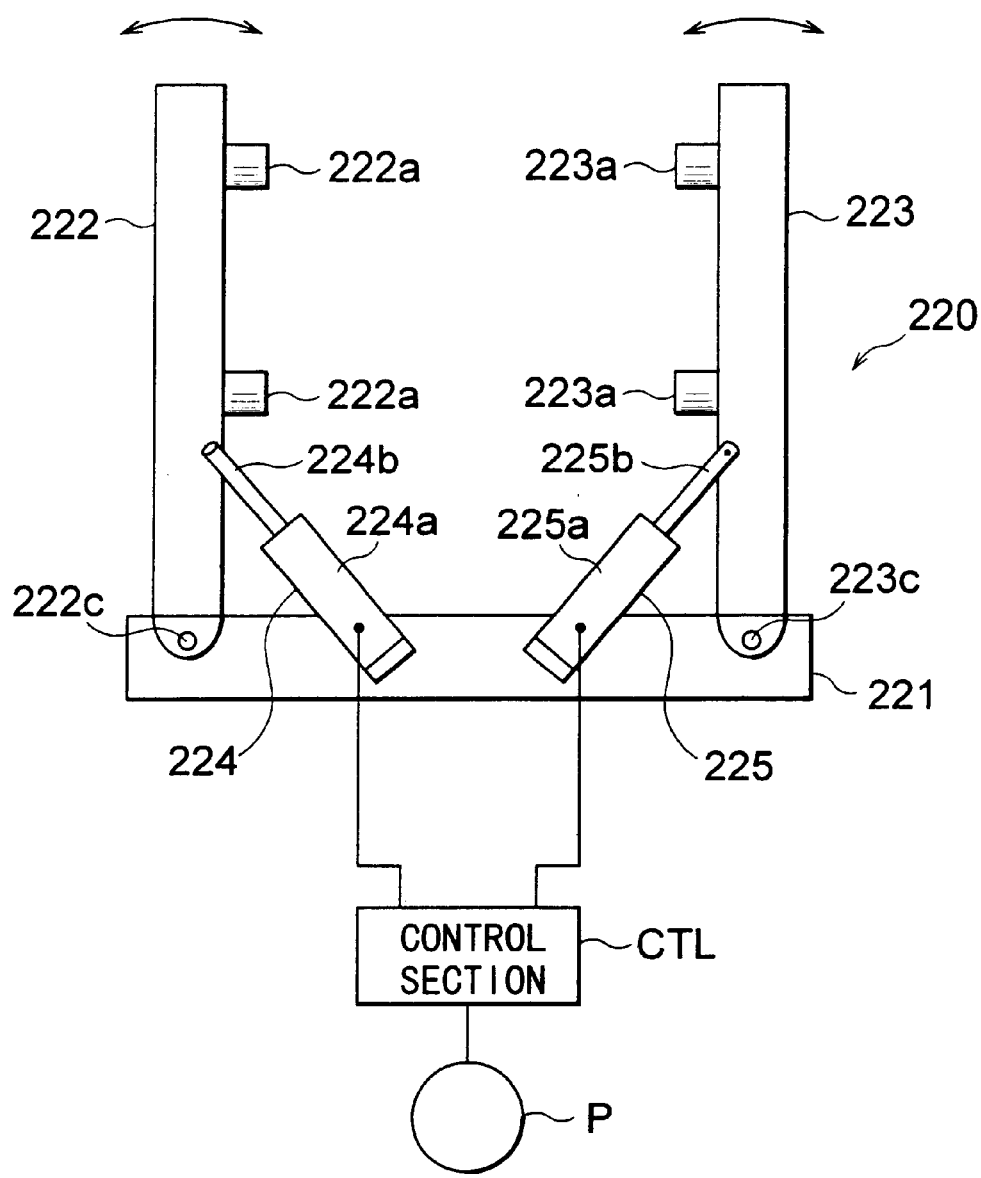
FIG. 13 is a top view of a transporting apparatus 220 in accordance with another embodiment.

FIG. 13 is a plan view of a transporting apparatus 220 in accordance with another embodiment as seen from thereabove. The transporting apparatus 220 suitable for transporting the mask case 10 of any of FIGS. 7 and 8 has a main body 221, and arms 222, 223 each having one end rotatably attached to the vicinity of a respective end of the main body 221. The arms 222, 223 are formed with cylindrical portions 222a, 223a, two by two, opposing each other. Each of the distance between the cylindrical portions 222a and the distance between the cylindrical portions 223a accurately coincides with the distance between the depressions 1b (see FIGS. 7 and 8).

The main body 221 and the arms 222, 223 are linked together by fixed pins 222c, 223c, which act as the centers of rotations of the arms 222, 223, and actuators 224, 225. The actuators 224, 225 have cylinder portions 224a, 225a fixed to the main body 221, and driving portions 224b, 225b fixed to the arms 222, 223. As in the embodiment shown in FIG. 10, the main body 221 itself is movable in such directions as forward/rearward, upward/downward, leftward/rightward, and the like by an unshown driving mechanism.

The cylinder portions 224a, 225a are linked to an air pressure source P (or hydraulic pressure source) by way of a control section CTL, so that the air pressure from the air pressure source P is introduced therein under the control of the control section CTL. The driving portions 224b and 225b can expand and contract according to the introduced air pressure.

When the mask case 10 is to be transported, the arms 223, 224, while in a state where they are open (the driving portions 224b, 225b are expanded), are caused to approach the placed mask case 10, and then the driving portions 224b, 225b are contracted under the control of the control section CTL. Upon this operation, the arms 222, 223 rotate so as to approach each other and hold the mask case 10 therebetween, whereby the cylindrical portions 222a, 223a enter the depressions 1b of the mask case 10. If the transporting apparatus 220 is moved up from this state, then the positioning of the mask case 10 is achieved as in the embodiment shown in FIG. 10.

Though FIG. 13 shows an embodiment in which the arms 222, 223 are rotated about the fixed pins 222c, 223c; in another embodiment, the fixed pins 222c, 223c slide, upon extracting and contracting operations of the driving portions 224b, 225b, in opening and closing directions of the arms 222, 223 in the main body 221, whereby the arms 222, 223, while being parallel to each other, operate to clasp the mask case 10. If the transporting apparatus 220 is moved up thereafter as in the above explanation, the positioning of the mask case 10 would be achieved.

As the actuators 224, 225, those using a cylinder portion driven by air pressure or hydraulic pressure are indicated in the present invention. However, without being restricted thereto, motors (including linear motors, electrostatic motors, and the like), for example, may be employed as actuators.

Also, in a modified example of the embodiment shown in FIG. 13, the actuators 224, 225 may be attached to the positions of the fixed pins 222c, 223c.

In this case, if rotary motors are employed as the actuators, for example, then the arms 222, 223 can directly be driven about the shafts of the rotary motors. If linear motors are employed as actuators, then the arms 222, 223 can directly be slid in the opening and closing directions of the arms 222, 223. Driving the arms 222, 223 as such enables the mask case 10 to be clasped.

Returning to FIG. 10, further explanations will follow. While the arms 21, 22 hold and transport the mask case 10 and are positioned above the stage 30 as mentioned above, operations of the arms 21, 22 by which the mask case 10 is delivered to the stage 30 will now be explained.

Figure 14:
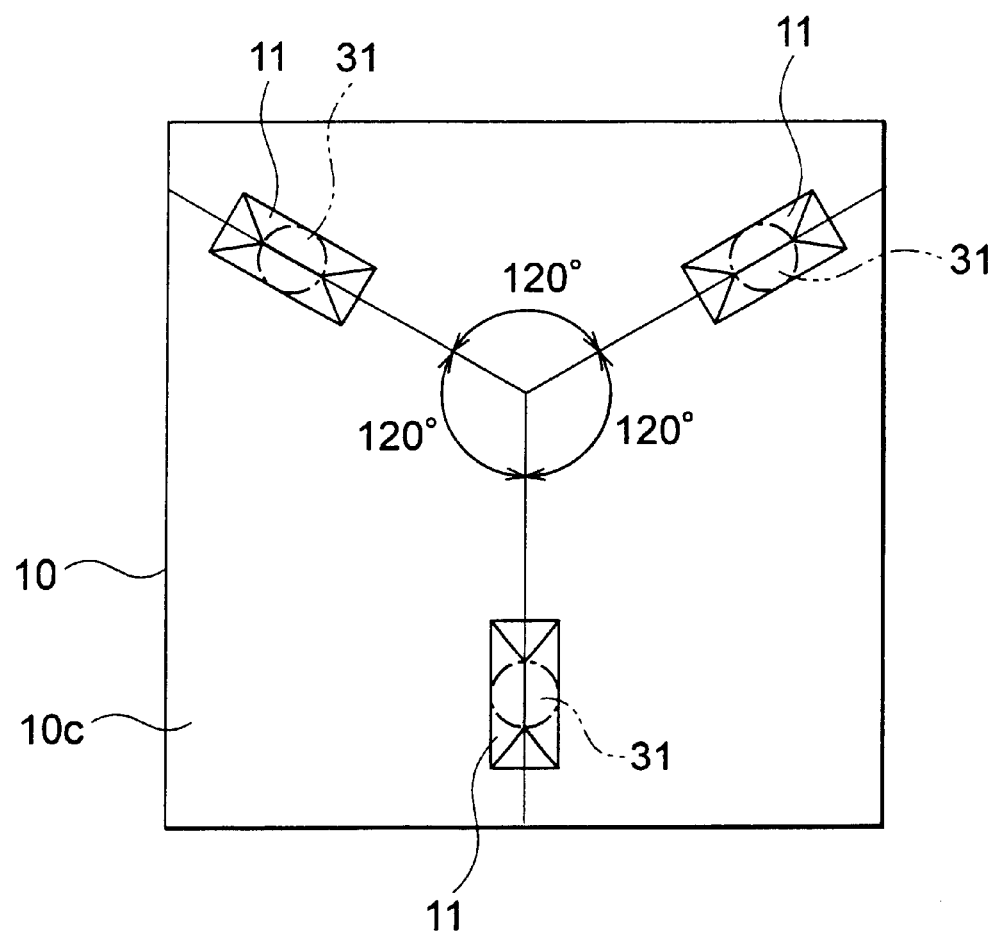
FIG. 14 is a bottom view of a mask case 10.
Figure 15:
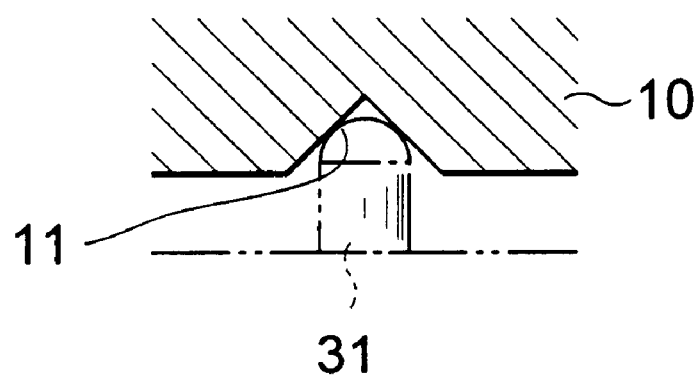
FIG. 15 is a sectional view of a triangular groove 11 in the mask case 10 of FIG. 14.

Here, as shown in FIG. 10, three vertically extending pins 31 are arranged on the stage 30 at constant intervals of 120 degrees. Each pin 31 has a hemispherical head portion 30a. FIG. 14 is a bottom view of the mask case 10, whereas FIG. 15 is a sectional view of a triangular groove 11 in the mask case 10 of FIG. 14.

On the bottom face 10c of the mask case 10, as shown in FIG. 14, three radially extending triangular grooves 11 are arranged at constant intervals of 120 degrees. As shown in FIG. 15, each triangular groove 11 has a triangular cross section.

As the arms 21, 22 descend from the state shown in FIG. 10, the bottom face 10c of the mask case 10 approaches the stage 30. Since the arms 21, 22 and the stage 30 are roughly positioned with respect to each other beforehand, the pins 31 of the stage 30 would enter their corresponding triangular grooves 11 as the mask case 10 descends.

When entering the triangular groove 11 with a misalignment, the pin 31 will abut against one of the bottom slopes of the triangular groove 11. In this case, the pin 31 receives a reaction force from the bottom slope, and the mask case 10 moves with respect to the stage 30 according to this reaction force.

On the other hand, since the triangular grooves 11 extend radially, the positions at which all the pins 31 rest at their corresponding centers of the triangular grooves 11 are uniquely determined. This state is shown in FIGS. 14 and 15. As a consequence, according to the reaction forces received by the pins 31 from the bottom slopes of the triangular grooves 11, the mask case 10 would be positioned at a predetermined position with respect to the stage 30. Namely, the positioning of the mask case 10 is effected when the mask case 10 is simply mounted on the stage 30 by means of the arms 21, 22.

Figure 16:
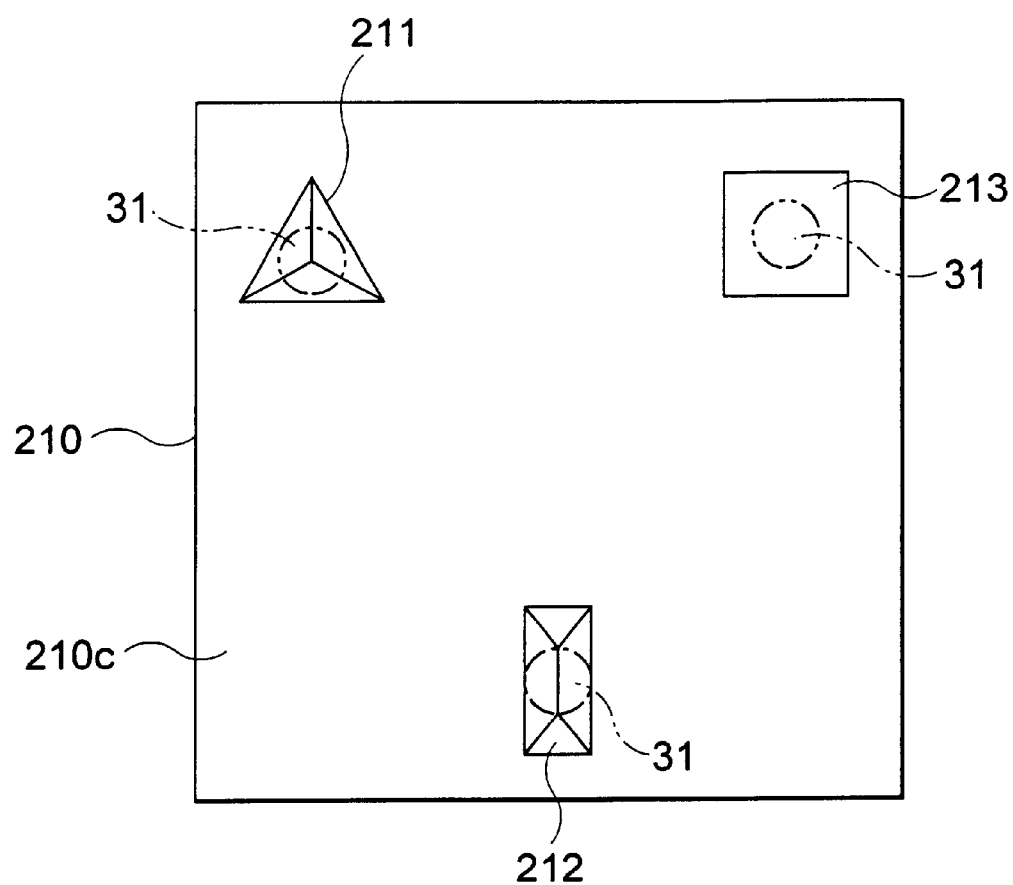
FIG. 16 is a bottom view of a mask case 210 in accordance with a sixth embodiment.
Figure 17:
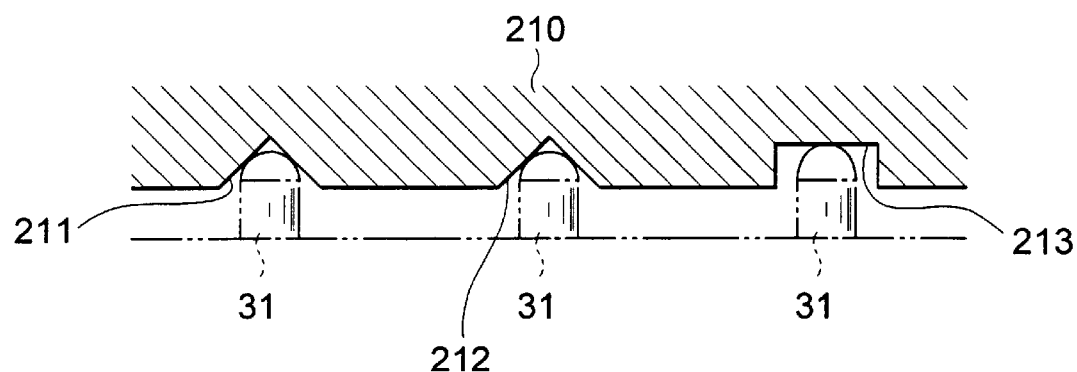
FIG. 17 is a sectional view of depressions 211, 212, 213 in the mask case 210 of FIG. 16, which is simulatively flattened.

FIG. 16 is a bottom view of a mask case 210 in accordance with a sixth embodiment, whereas FIG. 17 is a sectional view of depressions 211, 212, 213 in the mask case 210 of FIG. 16, which is simulatively flattened.

The depression 211 formed in the bottom face 210c has a triangular pyramidal form, the depression 212 is a triangular groove, and the depression 213 has a plane. As shown in FIG. 16, the depressions 211, 212, 213 are not arranged on a line. The above-mentioned pins 31 of the stage 30 are inserted in the depressions 211, 212, 213.

While holding a pin 31 at the center, the depression 211 is rotatable relative to the pin 31. Further, as the depression 212 holds a pin 31 at the center thereof, the arrangement of the pins 31 with respect to the respective depressions 211, 212 is uniquely determined. The depression 213 supports a pin 31 with its plane, thereby being uninvolved with the positioning of the mask case 210. As a consequence, the depressions 211, 212 and two pins engaging therewith are sufficient for simply achieving the positioning.

Figure 18:
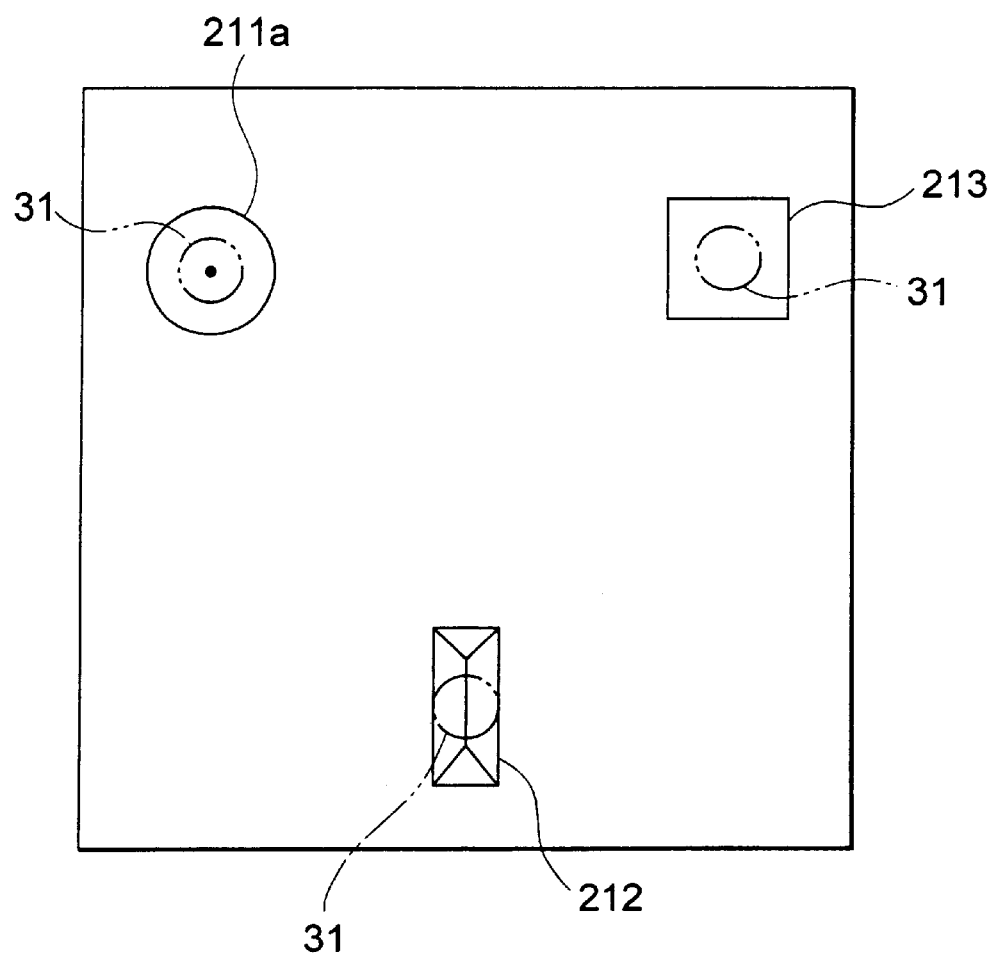
FIG. 18 is a bottom view of a mask case in accordance with a seventh embodiment.

FIG. 18 is a bottom view of a mask case 210 in accordance with a seventh embodiment. The depression 211 may not have a triangular pyramidal form as mentioned above, and similar effects can be attained, for example, when it is conical as shown in FIG. 18.

Figure 19:
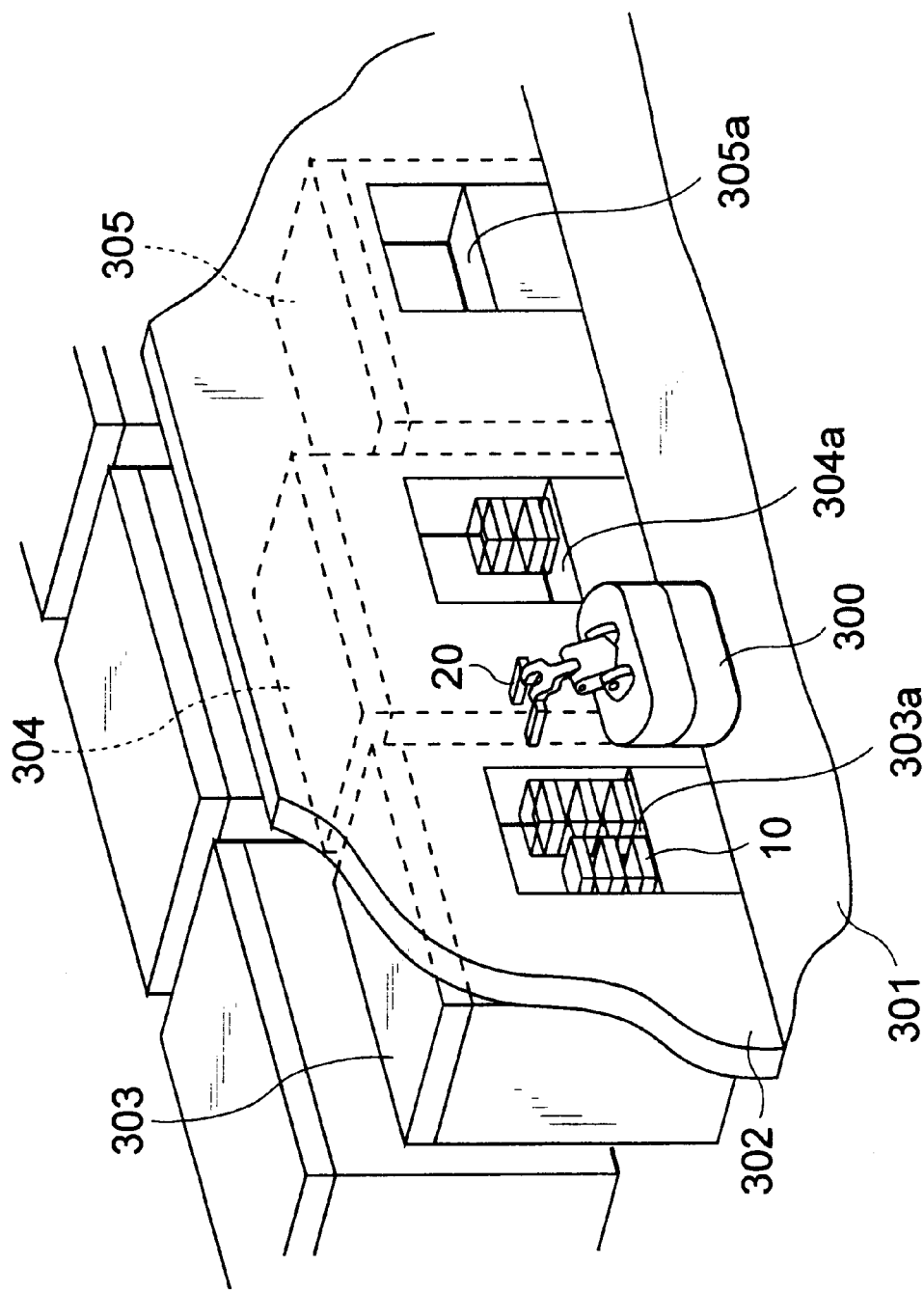
FIG. 19 is a view showing an embodiment in which the transporting apparatus of FIG. 10 is applied to an AGV (Automated Guided Vehicle)

FIG. 19 is a view showing an embodiment in which the transporting apparatus of FIG. 10 is applied to an AGV (Automated Guided Vehicle). An AGV 300 equipped with the transporting apparatus 20 shown in FIG. 10 is adapted to move and stop along a guide path 301 under radio guidance. Various processing apparatus 303 to 305 are disposed as being separated by a wall 302 from the guide path 301.

Operations of the AGV 300 will now be explained. First, the AGV 300 transports a mask case 10, while holding it with the arms 21, 22 (FIG. 10) of the transporting apparatus 20, from an unshown storage site to a delivery site 303a for the mask case in a cleaning apparatus 303 and places it there. In this case, three pins (not depicted) are arranged at the delivery site 303a, so that the positioning of the mask case 10 is achieved when the mask case 10 is simply placed at the delivery site.

In the cleaning apparatus 303, the mask case 10 is transported by an unshown transporting section to a cleaning site therewithin, and then is returned to the delivery site 303a after the cleaning of the mask is done.

The AGV 300 transports the mask case 10 accommodating therein the mask having finished cleaning, while holding it with the transporting apparatus 20, to a delivery site 304a for the mask in an adjacent pellicle mounting apparatus 304 and places it there. Three pins (not depicted) are similarly arranged, so that the positioning of the mask case 10 is achieved when the mask case 10 is simply placed at the delivery site.

In the pellicle mounting apparatus 304, the mask case 10 is transported by an unshown transporting section to a processing site therewithin, and then is returned to the delivery site 304a after the mounting of a pellicle is done.

Further, while similarly effecting the positioning, the AGV 300 transports the mask case 10 from the pellicle mounting apparatus 304 to a delivery site 305a of a dust inspecting apparatus 305, and then to an unshown exposure apparatus.

Figure 20:
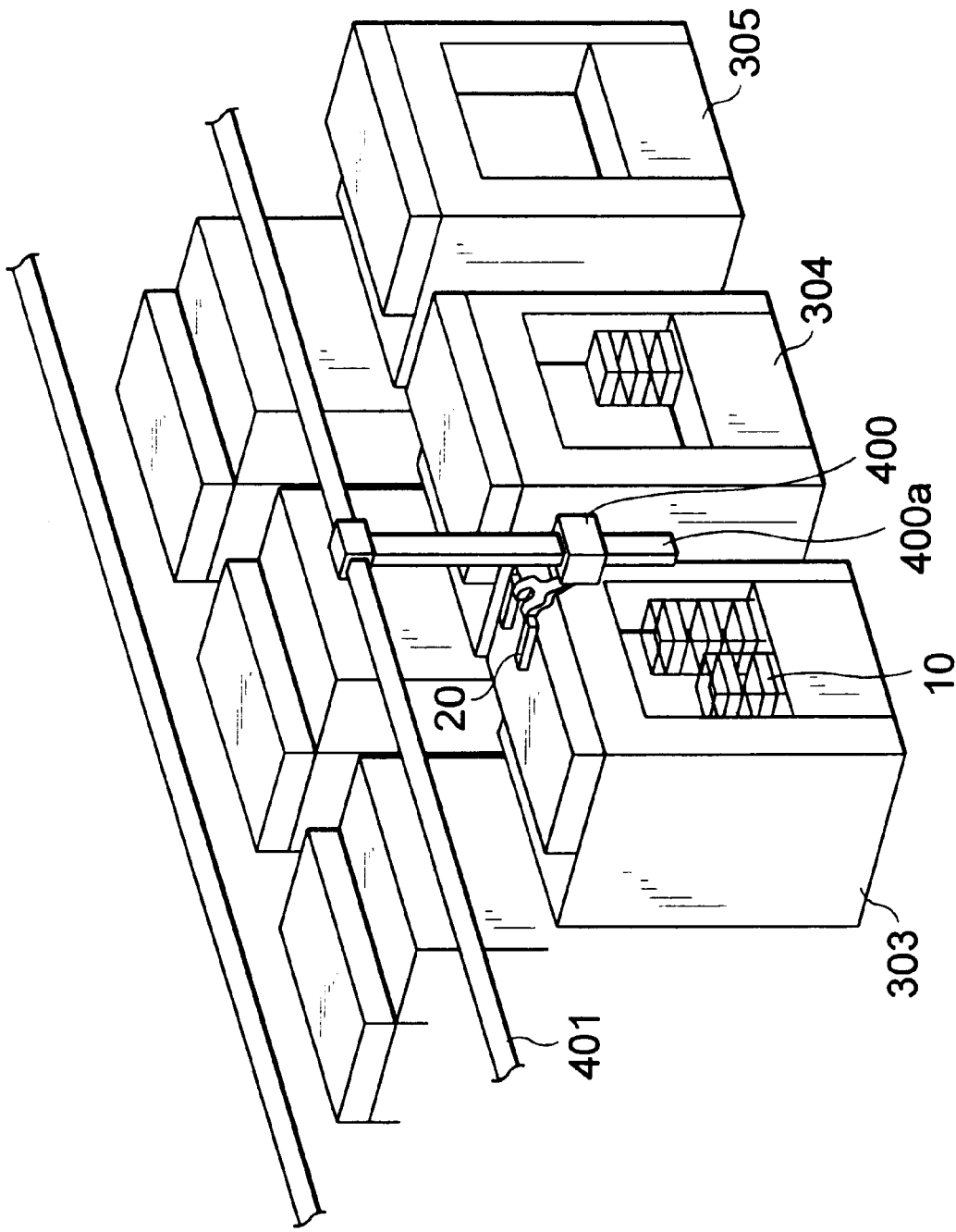
FIG. 20 is a view showing an embodiment in which the transporting apparatus of FIG. 10 is applied to OHT (Over Head Transportation)

FIG. 20 is a view showing an embodiment in which the transporting apparatus of FIG. 10 is applied to OHT (Over Head Transportation). OHT 400 equipped with the transporting apparatus 200 shown in FIG. 10 is movable up and down along a vertically extending pole 400a under radio guidance, and can move and stop along a guide rail 401 together with the pole 400a. Along the guide path 401, various processing apparatus 303 to 305 are arranged.

Since the OHT 400 differs from the AGV 300 only in that it moves along the guide rail 401, its operations will not be explained.

Figure 21:
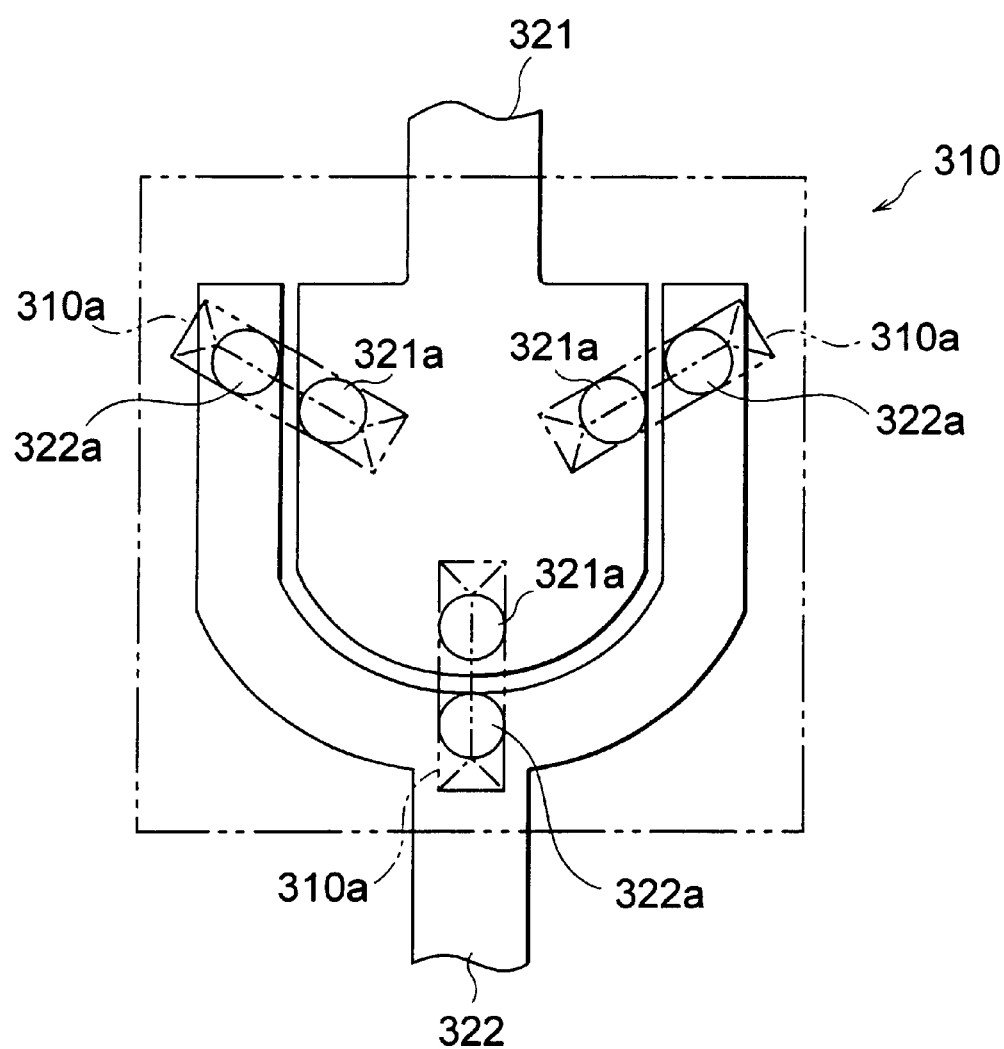
FIG. 21 is a top view showing an embodiment of transporting apparatus between which a mask case can be delivered.
Figure 22:
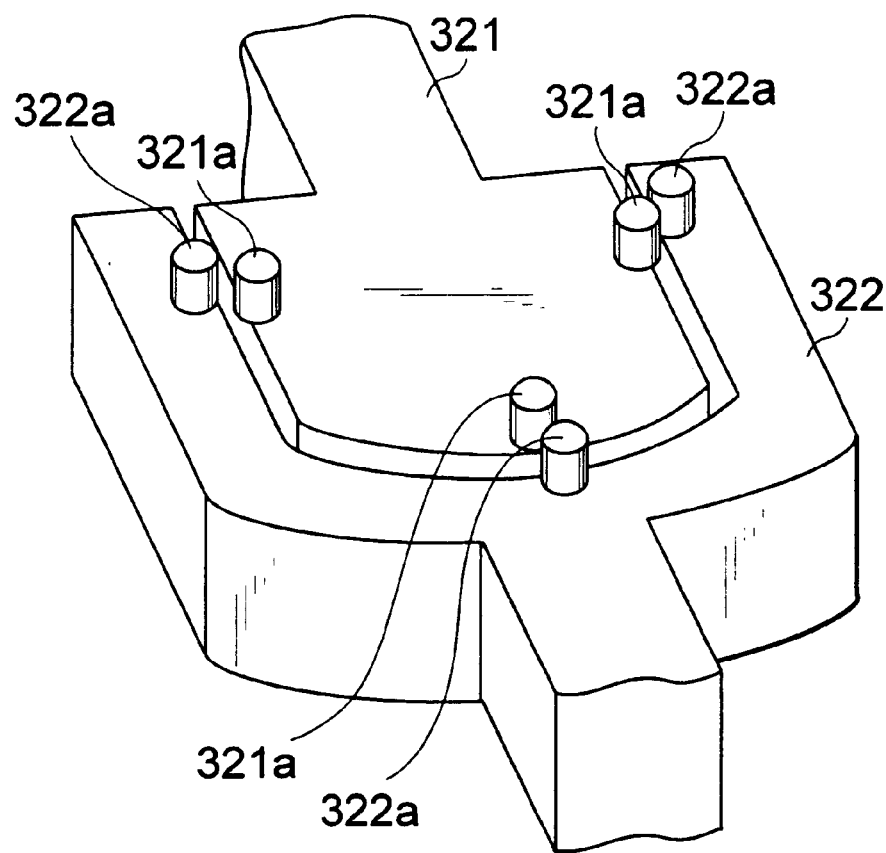
FIG. 22 is a perspective view showing the embodiment of transporting apparatus between which the mask case can be delivered.

Meanwhile, there are cases where the mask case is delivered between transporting apparatus without being placed at delivery sites. FIGS. 21 and 22 show an embodiment of transporting apparatus between which a mask case can be delivered, and are top and perspective views thereof, respectively.

In FIG. 21, a mask case 310 indicated by the dash-double-dot line has three longitudinally elongated V-grooves 310a having the same cross-sectional form, as compared with the mask case 10 shown in FIG. 14. A first transporting apparatus 321 having a scoop-shaped arm is formed with three pins 321a at constant intervals of 120 degrees. A second transporting apparatus 322 with a U-shaped arm has three pins 322a at constant intervals of 120 degrees in the same phase. Each of the pins 321a, 322a has a form identical to that of the pins 31 shown in FIGS. 14 and 15.

Here, it is assumed that only the first transporting apparatus 321 holds the mask case 310, with its pins 321a abutting against their corresponding V-grooves 310a. As the second transporting apparatus 322 approaches the mask case 310 from therebelow from this state, the pins 322a abut against the V-grooves 310a. As the second transporting apparatus 322 further moves up, the pins 321a of the first transporting apparatus 321 separate from the V-grooves 310a, and the mask case 310 is delivered to the second transporting apparatus 322 at this moment.

In this case, as explained with reference to FIGS. 14 and 15, the positioning between the second transporting apparatus 322 and the mask case 310 would be achieved according to the relationship between the pins having spherical head portions and the V-grooves. Therefore, even if a deviation is generated in the relative positional relationship between the transporting apparatus 321 and 322, the positioning of the mask case 310 with respect to the second transporting apparatus 322 is achieved at the instant when the mask case 310 is delivered to the second transporting apparatus 222, whereby its subsequent processing will become easier. Similar operations are effected also when the mask case 310 is delivered from the second transporting apparatus 322 to the first transporting apparatus 321.

As explained in the foregoing, the mask case in accordance with the above-mentioned embodiments is a mask case 210 accommodating the mask M formed with a pattern to be transferred to a substrate, wherein one outer wall face 210c of the mask case 210 is formed with first and second depressions 211, 211a, 212, and the first depression 211, 211a has one of conical and triangular pyramidal forms, whereas the second depression 212 has a V-groove form.

According to this mask case 210, since the first depression 211, 211a has one of conical and triangular pyramidal forms, whereas the second depression 212 has a V-groove form, if two pins 31, for example, as protrusions, are inserted in the first and second depressions 211, 211a, 212, then the mask case 210 is positioned with respect to the pins 31. As a consequence, if the bottom face of the mask case 210 is provided with the first depression 211, 211a and the second depression 212, then the positioning of the mask case 210 is achieved when it is simply placed at the site where the pins 31 are arranged.

Also, the mask case 10 is a mask case 10 accommodating a mask M formed with a pattern to be transferred to a substrate, wherein opposing first and second outer wall faces 10a, 10b of the mask case 10 are provided with engagement portions 1b, 1c having at least one of protruded and depressed forms, and the first outer wall face 10a has at least one engagement portion 1b, 1c, whereas the second outer wall face 10b has at least two engagement portions 1b, 1c.

According to the mask case of the present invention, since the opposing first and second outer wall faces 10a, 10b of the mask case 10 are provided with engagement portions 1b, 1c having at least one of protruded and depressed forms, and the first outer wall face 10a has at least one engagement portion 1b, 1c, whereas the second outer wall face 10b has at least two engagement portions 1b, 1c, if the transporting apparatus 20 whose respective faces opposing the first and second outer wall faces 10a, 10b are formed with support members 21a, 22a holds and lifts both of the outer wall faces 10a, 10b, then the engagement portions 1b, 1c and the support members 21a, 22a engage each other, whereby the mask case 10 can be positioned with respect to the transporting apparatus 20.

Further, the transporting apparatus 20 is a transporting apparatus 20 which transports a transportable substrate case 10 accommodating a substrate M, in which the first outer wall face 10a, 10b of the substrate case 10 and a second outer wall face 10c adjacent to the first outer wall face 10a, 10b are provided with engagement portions 1b, 1c, 11, wherein the transporting apparatus 20 has support members 21a, 22a, 31 for engaging and supporting at least one of the first engagement portion 1b, 1c of the first outer wall face 10a, 10b and the second engagement portion 11 of the second outer wall face 10c.

According to the transporting apparatus 20, since it has engagement and support members 21a, 22a, 31 which engage at least one of the first engagement portion 1b, 1c of the first outer wall face 10a, 10b and the second engagement portion 11 of the second outer wall face 10c in the substrate case 10, the transporting apparatus 20 can support different outer wall faces 10a, 10b, 10c of the substrate case 10, whereby a plurality of transporting apparatus 20 can deliver the substrate case 10 therebetween while effecting the positioning of the latter.

The above-mentioned transporting method is a transporting method of transporting a transportable substrate case 10 accommodating a substrate, in which the first outer wall face 10a, 10b of the substrate case 10 and a second outer wall face 10c adjacent to the first outer wall face 10a, 10b are provided with engagement portions 1b, 1c, 11, the method comprising the steps of positioning and transporting the substrate case 10 while engaging and supporting the first engagement portion 1b, 1c of the first outer wall face 10a, 10b, positioning and holding the substrate case 10 while engaging and supporting the second engagement portion 11 of the second outer wall face 10c, and delivering the substrate case 10 between the first engagement portion 1b, 1c and the second engagement portion 11.

Since this transporting method comprises the steps of positioning and transporting the substrate case 10 while engaging and supporting the first engagement portion 1b, 1c of the first outer wall face 10a, 10b, positioning and holding the substrate case 10 while engaging and supporting the second engagement portion 11 of the second outer wall face 10c, and delivering the substrate case 10 between the first engagement portion 1b, 1c and the second engagement portion 11, the positioning of the substrate case 10 is achieved at the same time when it is transported and when it is delivered. As a consequence, it becomes unnecessary to separately carry out positioning operations upon transportation or delivery of the substrate case 10, whereby the processing can be simplified.

The mask case and the transporting apparatus and transporting method for transporting the mask case in accordance with the present invention can be used when making a semiconductor, a liquid crystal display device, or the like by a photolithography process.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A transporting apparatus having a holding portion for holding a photomask case, said apparatus comprising:

three support members rising from a reference plane;

wherein the photomask case accommodates a photomask and is arranged on the three support members rising from the reference plane, the photomask case comprising, in a lower face thereof, at least two depressions engaging at least two of the support members;

wherein a side face of the photomask case has an engagement portion constituted by a protrusion or depression; and wherein the holding portion comprises an engagement and support member adapted to engage the engagement portion.

2. The transporting apparatus according to claim 1, further comprising a control section that controls movement of the engagement and support member.

3. The transporting apparatus according to claim 2, further comprising a driving section which moves two opposing engagement and support members synchronously with each other and which is controlled by the control section.

4. The transporting apparatus according to claim 1, further comprising an arm including the engagement and support member, the arm moving the photomask case from the three support members.

5. The transporting apparatus according to claim 4, wherein the arm corrects a positional relationship between the engagement portion and the engagement and support member when moving the photomask case.

6. The transporting apparatus according to claim 1, wherein the engagement and support member has a cylindrical portion that engages the engagement portion.

7. The transporting apparatus according to claim 1, wherein a plurality of engagement and support members grip the photomask case, and wherein the engagement and support members cross said reference plane.

8. The transporting apparatus according to claim 4, wherein the arm further comprises an air cylinder that drives the engagement and support member.

* * * * *